(12) United States Patent
Tansu et al.

(10) Patent No.: US 8,685,767 B2
(45) Date of Patent: Apr. 1, 2014

(54) SURFACE PLASMON DISPERSION ENGINEERING VIA DOUBLE-METALLIC AU/AG LAYERS FOR NITRIDE LIGHT-EMITTING DIODES

(75) Inventors: Nelson Tansu, Bethlehem, PA (US);
Hongping Zhao, Bethlehem, PA (US);
Jing Zhang, Bethlehem, PA (US);
Guangyu Liu, Bethlehem, PA (US)

(73) Assignee: Lehigh University, Bethlehem, PA (US)

( * ) Notice: Subject to any disclaimer, the term of this patent is extended or adjusted under 35 U.S.C. 154(b) by 474 days.

(21) Appl. No.: 12/963,117

(22) Filed: Dec. 8, 2010

(65) Prior Publication Data

US 2011/0133157 A1    Jun. 9, 2011

Related U.S. Application Data

(60) Provisional application No. 61/267,529, filed on Dec. 8, 2009.

(51) Int. Cl.
*H01L 33/32* (2010.01)
*H01L 33/44* (2010.01)

(52) U.S. Cl.
USPC .. 438/29; 438/47; 257/E33.025; 257/E33.068

(58) Field of Classification Search
USPC .................................................. 257/E33.033
See application file for complete search history.

(56) References Cited

U.S. PATENT DOCUMENTS

| | | | |
|---|---|---|---|
| 7,242,030 | B2 | 7/2007 | Wang et al. |
| 7,521,273 | B2 | 4/2009 | Erchak et al. |
| 2006/0038191 | A1 | 2/2006 | Onishi et al. |
| 2006/0273327 | A1 | 12/2006 | Im |
| 2007/0115474 | A1 | 5/2007 | Chaton et al. |
| 2007/0181889 | A1 | 8/2007 | Orita |
| 2008/0142782 | A1 | 6/2008 | Moon et al. |
| 2009/0101931 | A1 | 4/2009 | Zoorob et al. |
| 2009/0114940 | A1* | 5/2009 | Yang et al. ....................... 257/99 |
| 2009/0250685 | A1 | 10/2009 | Moon |
| 2009/0261317 | A1 | 10/2009 | Paiella |
| 2009/0267049 | A1 | 10/2009 | Cho et al. |
| 2009/0315069 | A1 | 12/2009 | Lee et al. |

FOREIGN PATENT DOCUMENTS

WO    2009/096919 A1    8/2009

* cited by examiner

*Primary Examiner* — Stephen W Smoot
(74) *Attorney, Agent, or Firm* — Saul Ewing LLP

(57) ABSTRACT

A double-metallic deposition process is used whereby adjacent layers of different metals are deposited on a substrate. The surface plasmon frequency of a base layer of a first metal is tuned by the surface plasmon frequency of a second layer of a second metal formed thereon. The amount of tuning is dependent upon the thickness of the metallic layers, and thus tuning can be achieved by varying the thicknesses of one or both of the metallic layers. In a preferred embodiment directed to enhanced LED technology in the green spectrum regime, a double-metallic Au/Ag layer comprising a base layer of gold (Au) followed by a second layer of silver (Ag) formed thereon is deposited on top of InGaN/GaN quantum wells (QWs) on a sapphire/GaN substrate.

11 Claims, 4 Drawing Sheets

US 8,685,767 B2

SURFACE PLASMON DISPERSION ENGINEERING VIA DOUBLE-METALLIC AU/AG LAYERS FOR NITRIDE LIGHT-EMITTING DIODES

CROSS-REFERENCE TO RELATED APPLICATIONS

This application claims priority to U.S. Provisional Application No. 61/267,529, filed Dec. 8, 2009, the entire contents of which are hereby incorporated fully by reference.

STATEMENT REGARDING FEDERALLY SPONSORED RESEARCH OR DEVELOPMENT

This invention was made with government support under US Department of Energy (DE-FC26-08NT01581) and US National Science Foundation (ECCS #0701421). The government has certain rights in the invention.

BACKGROUND OF THE INVENTION

III-Nitride semiconductors have significant applications for solid state lighting and lasers, power electronics, thermoelectricity, and solar cell applications. InGaN quantum wells (QWs) have been widely employed as an active region in nitride light-emitting diodes (LEDs) for solid state lighting application. The internal quantum efficiency in InGaN QWs LEDs is limited by: 1) high dislocation density leading to large non-radiative recombination rate, and 2) charge separation due to the existence of the electrostatic field in the QW leading to significant reduction of the radiative recombination rate. The detrimental effects become more severe for InGaN QWs, in particular as the emission wavelength is extended into the green or yellow spectral regimes Several approaches have been demonstrated to suppress the charge separation issue by employing novel QWs with improved electron-hole wave function overlap ($\Gamma_{e\_hh}$) such as 1) nonpolar InGaN QWs, 2) staggered InGaN QW, 3) InGaN QW with δ-AlGaN layer, 4) type-II InGaN-based QW, 5) strain-compensated InGaN—AlGaN QW, and InGaN-delta-InN QW.

Another approach to enhance the radiative recombination rate and internal quantum efficiency of InGaN QWs active region is by employing surface-plasmon (SP) based LEDs. Since the InGaN QWs are coupled to surface plasmon mode at the interface of metallic film and semiconductor, the radiative recombination rate in the QWs can be enhanced due to the increased photon density of states near the surface plasmon frequency resulting from Purcell effect enhancement factor. The peak Purcell enhancement factor occurs at the surface plasmon frequency of a structure. Recent experiments have reported significant Purcell enhancement factor for InGaN/GaN QW by using a single Ag metallic layer, leading to an increase in internal quantum efficiency and radiative recombination rate. The use of a single metallic layer leads to strong enhancement near the surface plasmon frequencies, and the enhancement will reduce for frequencies further away from the surface plasmon resonant frequency. A problem exists, however, in that no enhancement is obtained for frequencies above the surface plasmon frequency of the single metallic layer structure.

Another recent approach, based on metallo-dielectric stacked structures, proposes "tuning" the surface plasmon frequency by using one or more metal layers each spaced apart by a dielectric layer. Tuning can be accomplished by changing the combination of dielectric and metallic material as well as the thickness of the dielectric spacer layer. However, the Purcell enhancement factor based on this approach becomes reduced for the frequency regimes away from the surface plasmon frequency of the particular metal in use. The metallo-dielectric approach also requires complex processing for hybrid deposition of both dielectric and metallic layers, since the deposition environment for the metal is different than the deposition environment of the dielectric.

SUMMARY OF THE INVENTION

A double-metallic deposition process is used whereby adjacent layers of different metals are deposited on a substrate. The surface plasmon frequency of a base layer of a first metal is tuned by the surface plasmon frequency of a second layer of a second metal formed thereon. The amount of tuning is dependent upon the thickness of the metallic layers, and thus tuning can be achieved by varying the thicknesses of one or both of the metallic layers.

In a preferred embodiment directed to enhanced LED technology in the green spectrum regime, a double-metallic Au/Ag layer comprising a base layer of gold (Au) followed by a second layer of silver (Ag) formed thereon is deposited on top of InGaN/GaN quantum wells (QWs) on a sapphire/GaN substrate. This tunes the Purcell peak enhancement of the spontaneous recombination rate for nitride light-emitting diodes (LEDs). The dispersion relation is calculated by using a transfer matrix method. By modifying the ratio of the double-metallic layer (Au/Ag) thickness, the Purcell peak enhancement factor is widely tuned between the surface plasmon frequencies of Au/GaN ($\omega_{sp\_Au}$) and Ag/GaN ($\omega_{sp\_Au}$). This approach can be widely applied for different combinations of double-metallic layers with varied surface plasmon resonant frequency.

DETAILED DESCRIPTION

This invention presents a novel approach to achieve wide-spectrum tuning of the surface plasmon resonant frequency for III-Nitride photonics devices by employing double-metallic layers, comprising different adjacent metals, on GaN. In a preferred embodiment described in more detail below, the use of double metallic Au/Ag layers enables the tuning of the surface plasmon frequency over a large frequency range between the surface plasmon frequencies of the individual metals ($E_{sp\_Ag}=\hbar\omega_{sp\_Ag}$ and $E_{sp\_Au}=\hbar\omega_{sp\_Au}$), while maintaining a large Purcell enhancement factor throughout the frequency range. The use of double metallic Au/Ag layers enables tuning with the green spectrum regime for LEDs. The use of double-metallic layers also offers a practical and easy approach to device implementation. Photoluminescence (PL) studies were carried out to provide the proof-of-concept experimental demonstration of the Purcell peak enhancement factor by using double-metallic Au/Ag layers coupled with the InGaN/GaN QWs.

Figure 1:
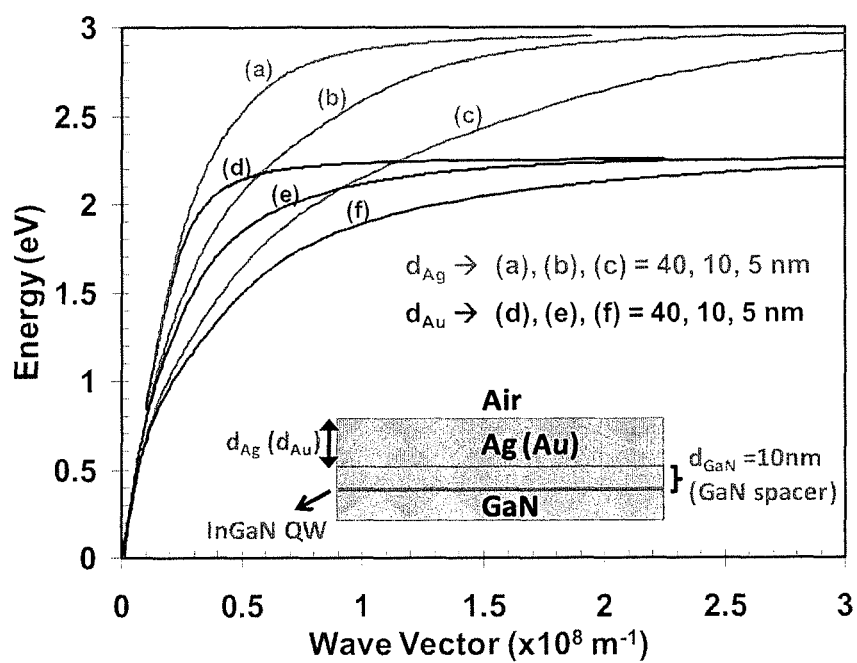
FIG. 1 illustrates a surface plasmon (SP) dispersion curves of thin Ag (Au) film on GaN substrate with Ag (Au) film thicknesses of 40, 10, and 5 nm.

FIG. 1 shows the surface plasmon dispersion curves (energy versus wave vector) of a single thin Ag (or Au) film on a GaN substrate as a function of the Ag (or Au) thicknesses of 40 nm, 10 nm, and 5 nm. As shown in FIG. 1, a single metal film deposited on a GaN substrate results in a particular surface plasmon resonance frequency (i.e. $E_{sp\_Ag}$=2.8 eV, and $E_{sp\_Au}$=2.2 eV), which cannot be tuned by modifying the thickness of the single metal film, although the dispersion relation shows different trend for different thicknesses of the metal films.

Figure 2:
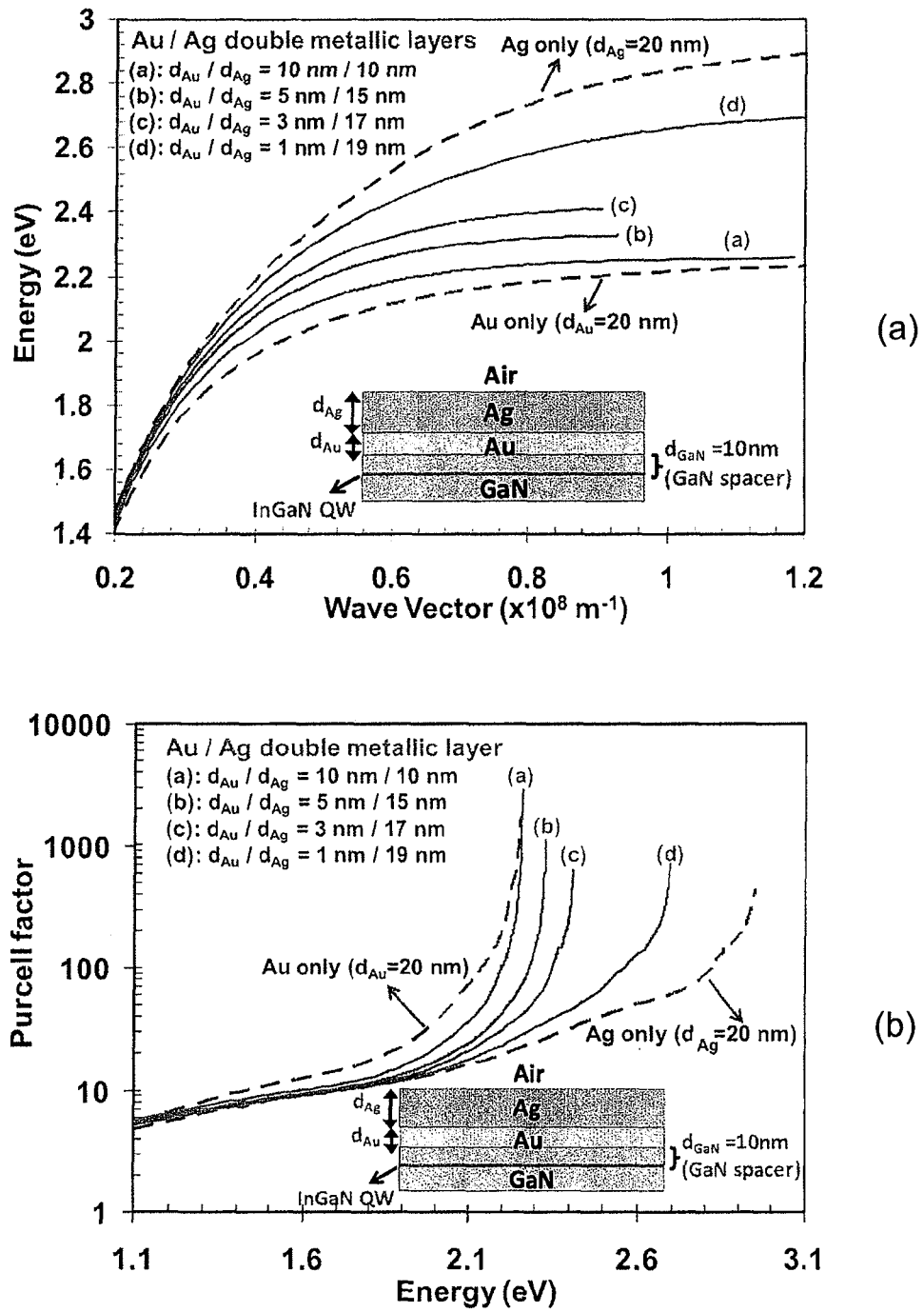
FIG. 2 illustrates (a) Surface plasmon dispersion curves and (b) Purcell factor as a function of energy for double-metallic Au/Ag layers on GaN substrate with Au/Ag layer thicknesses of 10 nm/10 nm, 5 nm/15 nm, 3 nm/17 nm, and 1 nm/19 nm. The corresponding surface plasmon dispersion curves and Purcell factors for Ag-only/GaN (dAg=20 nm) and Au-only/GaN (dAu=20 nm) are also plotted.

The use of double-metallic layers (Au/Ag) with optimized thicknesses allows the tuning of the Purcell enhancement factor between the surface plasmon frequencies of Ag/GaN ($\omega_{sp\_Ag}$) and Au/GaN ($\omega_{sp\_Au}$). By varying the thickness combination of Au ($d_{Au}$) and Ag ($d_{Ag}$) layers, the double-metallic layers can be used to achieve large Purcell enhancement for SP-based InGaN QW LEDs. FIG. 2(a) shows the surface plasmon dispersion curves of thin double metallic Au/Ag layers on a GaN substrate with Au/Ag layer thicknesses of 0 nm/20 nm (i.e., Ag-only), 10 nm/10 nm, 5 nm/15 nm, 3 nm/17 nm, 1 nm/19 nm, and 20 nm/0 nm (i.e., Au-only). Note that the total thickness of the double metallic layers is constant ($d_{total}$=20 nm) in this analysis which is done for comparison purposes only (i.e., the total thickness of the double metallic layers can be variable and will still fall within the scope of the claimed invention). By modifying the ratio of the Au and Ag thicknesses, the dispersion curve can be engineered with different surface plasmon frequencies between $\omega_{sp\_Ag}$ and $\omega_{sp\_Au}$.

FIG. 2(b) plots the Purcell factor as a function of energy for thin Au/Ag layers on a GaN substrate with Au/Ag layer thickness of 0 nm/20 nm (Ag-only), and 10 nm/10 nm, 5 nm/15 nm, 3 nm/17 nm, 1 nm/19 nm, and 20 nm/0 nm (Au-only). FIG. 2(b) indicates that the Purcell enhancement factor can be tuned between the surface plasmon frequencies of Ag/GaN ($\omega_{sp\_Ag}$) and Au/GaN ($\omega_{sp\_Au}$) without decreasing the Purcell factor. Note that the ratio of the thickness of the double metallic Au/Ag film determines the surface plasmon resonant frequency. Thus, it is crucial to optimize the thickness of the Au layer to tune the surface plasmon frequency between $\omega_{sp\_Ag}$ and $\omega_{sp\_Au}$.

Figure 3:
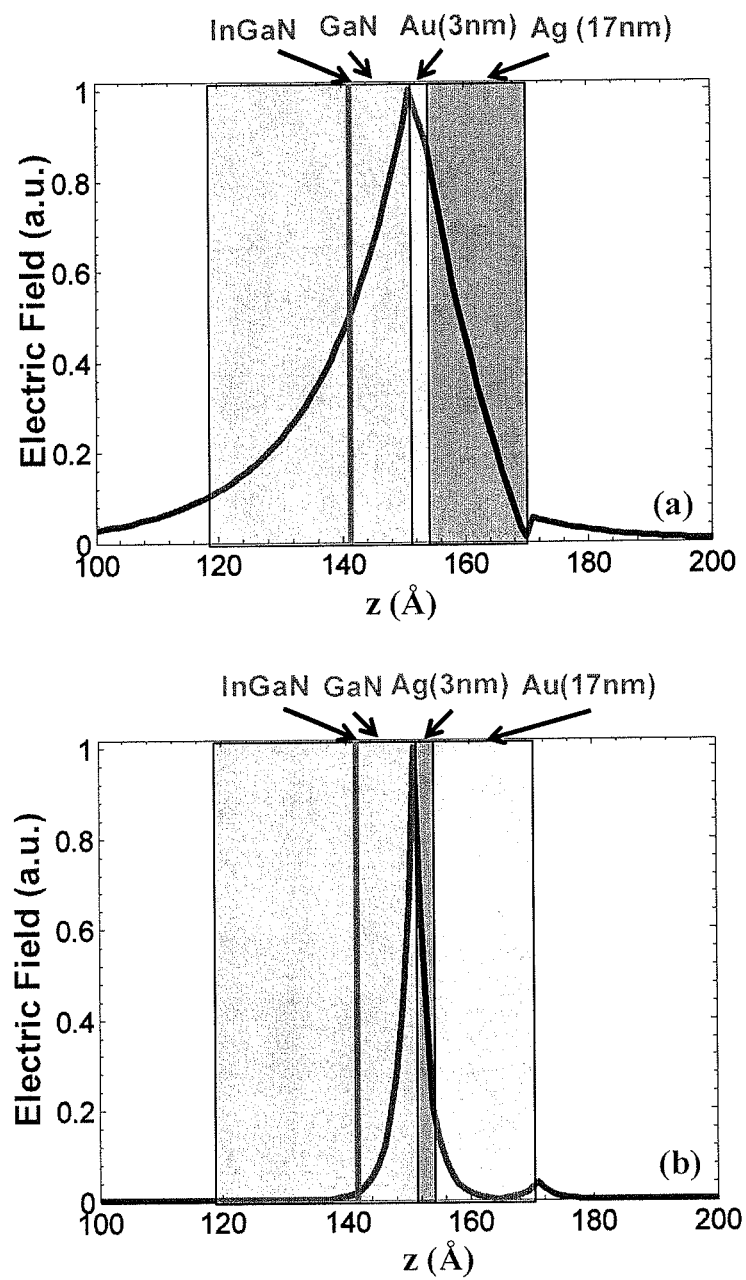
FIG. 3 illustrate electric fields for double-metallic (a) Au (3 nm)/Ag (17 nm) and (b) Ag (3 nm)/Au (17 nm) layers on a InGaN/GaN substrate.

Note that the sequence of the double-metallic layers is important for ensuring wide tuning of the Purcell factor. To better illustrate the effect of the sequence of the double-metallic layers on the coupling between the QW and the surface plasmon electric field, FIGS. 3(a) and 3(b) show the electric field for the double-metallic layers of Au (3 nm)/Ag (17 nm) and Ag (3 nm)/Au (17 nm) on InGaN/GaN, respectively. By comparing FIGS. 3(a) and 3(b), it can be seen that the surface plasmon electric field of Au/Ag double-metallic layers is strongly coupled to the InGaN QW active region while the surface plasmon electric field of Ag/Au double-metallic layers shows almost no coupling to the InGaN QW. From FIG. 3(a), it can be seen that the surface plasmon electric field interacts with both Au and Ag films, which results in an average surface plasmon resonant energy of Au/GaN and Ag/GaN.

Figure 4:
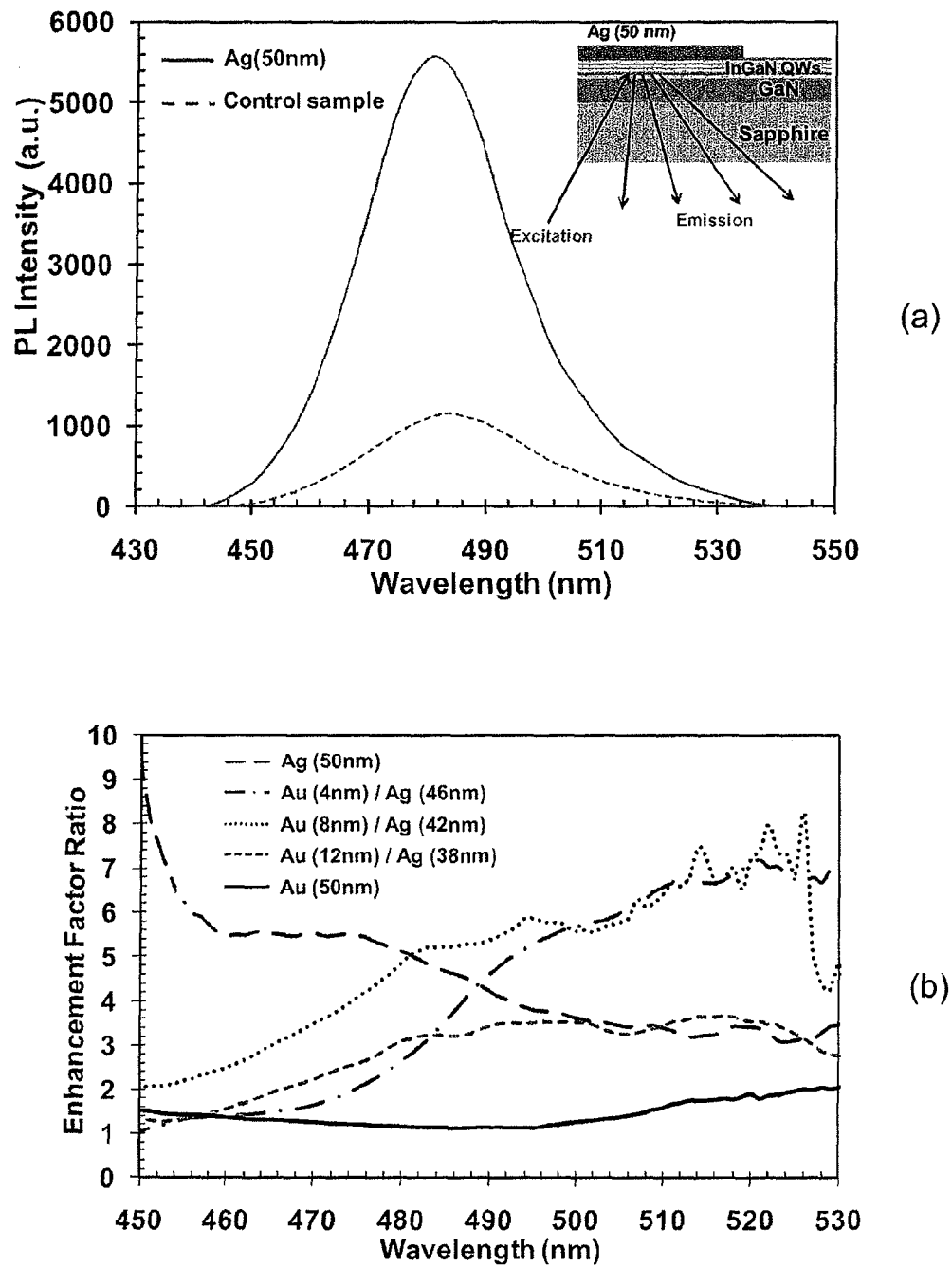
FIG. 4 illustrates (a) photoluminescence (PL) spectra comparison of InGaN QWs coated with 50-nm silver and control sample (with no metal coating), and (b) the enhancement ratios of PL intensities of the InGaN QWs with metal coating and without metal coating as a function of the wavelength for various double-metallic Au/Ag layers thicknesses.

Experimental studies were conducted by the Applicant herein to demonstrate the concept of the surface plasmon frequency tuning using the double-metallic layers on InGaN/GaN QWs. Conventional 4-period InGaN QWs emitting at peak wavelength of 465 nm were grown by metal organic chemical vapor deposition (MOCVD) on u-GaN (3 µm)/sapphire substrate (double side polished). On top of the fourth InGaN QW, a GaN spacer layer thickness was 10 nm. Metals with total thickness of 50 nm were evaporated on top of the InGaN/GaN QWs by thermal evaporation. PL measurements were performed by exciting the InGaN QWs with a 410 nm InGaN diode laser from the bottom of the substrate as shown in the inset of FIG. 4(a). A silicon photo-detector was used to collect the emission from the sample. PL measurements were performed for InGaN QWs deposited with different metallic layers as follows: 1) 50-nm Ag, 2) 4-nm Au/46-nm Ag, 3) 8-nm Au/42-nm Ag, 4) 12-nm Au/38-nm Ag, and 5) 50-nm Ag. The PL measurements for these samples were compared with the corresponding control InGaN QWs without metal deposition.

FIG. 4(a) shows the PL spectrum for the InGaN/GaN QWs coated with 50-nm silver, which is compared with the control InGaN QW sample without metal coating. From FIG. 4(a), significant PL intensity enhancement is observed by depositing Ag on top of InGaN/GaN QWs at peak emission wavelength of 480 nm. FIG. 4(b) plots the enhancement ratios of PL intensities of the InGaN QWs with metal coating and without metal coating as a function of the wavelength. The Ag-coated InGaN QW sample shows larger enhancement at shorter wavelength due to the higher surface plasmon frequency. By using the double-metallic Au/Ag layers on top of InGaN QWs, the peak enhancement ratio shifts to the longer wavelength region as shown in FIG. 4(b). The Au-coated InGaN QWs shows the minimum enhancement ratio between 1.1-1.6, which is due to the reflection from the Au layer.

The results shown in FIG. 4(b) clearly indicate that the use of an Ag-only surface plasmon structure resulted in an enhancement factor with decreasing value as the wavelength is away from the surface plasmon frequency. However, the use of Au/Ag double metallic layer structure leads to an increase in the Purcell enhancement factor for emission wavelengths between the two surface plasmon frequencies, with enhancement up to 7-times in the green spectral regime. Strong enhancement in the internal quantum efficiency for green-emitting InGaN QWs is of great interest, in particular since InGaN QWs LEDs suffer from significant charge separation in this wavelength regime.

In summary, the use of double-metallic layers (comprising the different metal layers) on top of a semiconductor presents a novel approach to tuning the surface plasmon frequency between the two individual surface plasmon frequencies of the metals on top of the semiconductor. The Purcell enhancement factor for Au/Ag with varied thickness ratios on GaN shows that the tuning of the surface plasmon frequency without the decrease of the Purcell enhancement factor is achieved. PL studies demonstrated the concept of the tuning of the SP dispersion by using the double-metallic layers deposited on top InGaN/GaN QWs. The concept of tuning of the surface plasmon frequency using double-metallic Au/Ag layers deposited on top of GaN can be extended with other metallic layers on GaN to tune to other SP frequencies including from UV up to the red spectral regime, from about 200 nm up to 100 micron. This novel approach realizes surface plasmon based LEDs with significantly enhanced radiative recombination rate and radiative efficiency for a wide frequency range in the visible spectral regime.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

We claim:

1. A method of fabricating an InGaN quantum well LED having a tunable surface plasmon frequency, comprising:
   forming a GaN substrate;
   forming a first metallic layer of a first metallic material on said substrate, said first metallic layer having a first surface plasmon frequency and having a first thickness; and
   forming a second metallic layer of a second metallic material on said first metallic layer, said second metallic layer having a second surface plasmon frequency that is higher than said first surface plasmon frequency and having a second thickness; and
   tuning the plasmon frequency of said LED to a predetermined value by selecting a predetermined ratio of said first thickness to said second thickness.

2. The method as set forth in claim 1, wherein said first metallic material comprises gold.

3. The method as set forth in claim 2, wherein said second metallic material comprises silver.

4. The method as set forth in claim 3, wherein a ratio of gold thickness to silver thickness is selected so that the surface plasmon frequency of said LED is the green spectral regime.

5. The method as set forth in claim 3, wherein a ratio of gold thickness to silver thickness is selected so that the surface plasmon frequency of said LED is in the range of about 420 nm to 560 nm.

6. The method as set forth in claim 5, wherein a ratio of gold thickness to silver thickness is selected so that the surface plasmon frequency of said LED is in the range of about 510 nm to 550 nm.

7. The method as set forth in claim 5, wherein a ratio of gold thickness to silver thickness is selected so that the surface plasmon frequency of said LED is about 520 nm.

8. The method as set forth in claim 5, wherein a ratio of gold thickness to silver thickness is selected so that the surface plasmon frequency of said LED is about 530 nm.

9. The method as set forth in claim 5, wherein a ratio of gold thickness to silver thickness is selected so that the surface plasmon frequency of said LED is about 540 nm.

10. The method as set forth in claim 5, wherein a ratio of gold thickness to silver thickness is selected so that the surface plasmon frequency of said LED is about 550 nm.

11. The method as set forth in claim 1, wherein a ratio of a thickness of said first metallic layer to a thickness of said second metallic layer is selected so that the surface plasmon frequency of said LED is in the range of about 200 nm to 1 micron.

* * * * *